(12) United States Patent
Chin et al.

(10) Patent No.: US 8,369,371 B1
(45) Date of Patent: Feb. 5, 2013

(54) PASSIVATED SEMICONDUCTOR SURFACES

(75) Inventors: Aland K. Chin, Sharon, MA (US);
Peter Chow, Eden Prairie, MN (US)

(73) Assignee: Science Research Laboratory, Inc., Somerville, MA (US)

( * ) Notice: Subject to any disclaimer, the term of this patent is extended or adjusted under 35 U.S.C. 154(b) by 0 days.

(21) Appl. No.: 13/275,839

(22) Filed: Oct. 18, 2011

Related U.S. Application Data

(60) Provisional application No. 61/405,853, filed on Oct. 22, 2010.

(51) Int. Cl.
*H01S 5/00* (2006.01)
(52) U.S. Cl. ............... 372/49.01; 372/44.01; 372/43.01; 372/45.01
(58) Field of Classification Search ............... 372/49.01, 372/44.01, 43.01, 45.01
See application file for complete search history.

(56) References Cited

U.S. PATENT DOCUMENTS

| 6,590,920 B1 * | 7/2003 | McElhinney et al. ...... 372/49.01 |
| 6,677,618 B1 * | 1/2004 | Horie et al. ...................... 257/94 |
| 2010/0301454 A1 * | 12/2010 | Zhang et al. .................. 257/614 |

* cited by examiner

*Primary Examiner* — Kinam Park
(74) *Attorney, Agent, or Firm* — Burns & Levinson LLP; Orlando Lopez

(57) ABSTRACT

The method of these teachings includes processing a semiconductor structure forming an active waveguide of a semiconductor laser in an environment free of contamination in order to provide contamination free mirror facets at the ends of the active waveguide, and depositing a single crystal passivation layer comprised of a semiconductor whose bandgap exceeds that of the active layer and the waveguide layers and that does not form misfit dislocations with the laser diode semiconductor, the deposition occurring at a temperature at which the semiconductor structure does not degrade.

12 Claims, 2 Drawing Sheets

---

FORMING SUBSTANTIALLY CONTAMINATION FREE MIRROR FACETS ON A SEMICONDUCTOR LASER STRUCTURE
110

DEPOSITING, AT A TEMPERATURE AT WHICH THE SEMICONDUCTOR STRUCTURE DOES NOT DEGRADE, ON THE MIRROR FACETS A SINGLE CRYSTAL PASSIVATION LAYER
120

```
┌─────────────────────────────────────────────────────────────┐
│  FORMING SUBSTANTIALLY CONTAMINATION FREE MIRROR FACETS ON  │
│           A SEMICONDUCTOR LASER STRUCTURE                   │
│                          110                                │
└─────────────────────────────────────────────────────────────┘
                              │
                              ▼
┌─────────────────────────────────────────────────────────────┐
│  DEPOSITING, AT A TEMPERATURE AT WHICH THE SEMICONDUCTOR    │
│  STRUCTURE DOES NOT DEGRADE, ON THE MIRROR FACETS A SINGLE  │
│              CRYSTAL PASSIVATION LAYER                      │
│                          120                                │
└─────────────────────────────────────────────────────────────┘
```

Fig. 2

PASSIVATED SEMICONDUCTOR SURFACES

CROSS REFERENCE TO RELATED APPLICATIONS

This application claims priority to U.S. Provisional Application Ser. No. 61/405,853, filed Oct. 22, 2010, entitled, "PASSIVATED SEMICONDUCTOR SURFACES," which is incorporated by reference herein in its entirety for all purposes.

BACKGROUND

This invention relates generally to semiconductor laser structures, and, more particularly, to passivated semiconductor laser structures.

A semiconductor laser device which emits laser light from an end facet thereof is a typical example of the semiconductor devices produced by use of the cleavage of semiconductor crystals. A semiconductor laser device of this type has a Fabry-Perot resonator having a pair of semiconductor facets and functioning on the basis of the difference in refractive index between the semiconductor crystals and the air outside the device.

In recent years, semiconductor laser devices such as described above have widely come into practical use. One exemplary use is as light sources for optical disc driving units and the like. In many instances, when semiconductor laser devices are used as the light sources, they are required to have high reliability even at a high output power level of about 50-100 mw or more. Furthermore, for the purpose of attaining higher operational speed of an entire system, there is a demand for semiconductor laser devices which can attain laser oscillation at a still higher output power level. When semiconductor laser devices are used as the light sources for high-resolution laser printers or for optical pumping of solid state laser devices such as a YAG laser, they are required to attain laser oscillation at an output power level of 100 mW or more.

The high output power operation of such a semiconductor laser device, however, causes the deterioration of its end facet from which laser light is emitted. The deterioration in the light-emitting facet increases the current required for driving the semiconductor laser device, and eventually it becomes impossible for the laser device to attain laser oscillation. Therefore, with respect to semiconductor laser devices, it is difficult to attain high reliability at a high output power level.

One explanation of the principal cause for the deterioration of the light-emitting facet is described hereinbelow. First, heat is generated locally at the light-emitting facet due to the high optical density at this facet and also due to non-radiative recombination caused by surface states. As the temperature in the area near the facet increases, the band gap in that area becomes smaller, which in turn increases the absorption of light. The increase in the light absorption generates carriers, which are then trapped in the surface states, and nonradiative recombination of the carriers occurs. This further generates heat in the area near the light-emitting facet. This process is repeated until the temperature in the area near the facet reaches the melting point of the semiconductor, resulting in facet breakdown.

A number of approaches have been previously proposed for passivating the facets in order to increase the lifetime of the semiconductor laser.

For the prevention of such deterioration in the resonator facet, there has been proposed a semiconductor laser device having a semiconductor layer with a band gap larger than that of an active layer (i.e., a large-band-gap layer) formed on the facet.

In one instance, a contamination-free mirror facet is provided, followed by an in-situ application of a continuous, insulating (or low conductive) passivation layer. This layer is formed with material, Si, Ge or Sb, that acts as a diffusion barrier for impurities capable of reacting with the semiconductor but which does not itself react with the mirror surface. The contamination-free mirror surface is obtained by cleaving in a contamination-free environment, or by cleaving in air, followed by mirror etching, and subsequent mirror surface cleaning.

In another instance, facets formed by etching on a wafer are brought into contact with a solution containing sulfur, e.g., a solution of ammonium sulfide. The wafer is then heated to such a temperature that the sulfur is removed through sublimation from the resonator facets. A semiconductor layer, which has a band gap greater than that of the active layer, for example AlGaAs, is grown on the surface of the facets.

In yet another instance, the facet is treated with a sulfur-containing or selenium-containing material to reduce surface recombination velocity, followed by the deposit of a GaN, GaP, InGaP, GaAsP, ZnS or ZnSe layer to seal indefinitely the surface from oxidation and other environmental contaminants.

In still another instance, a non-absorbing layer of, for example, InGaP and having a band gap greater than the band gap of an active layer of a semiconductor laser main body is formed on the facets of the semiconductor laser main body. A diffusion blocking layer of Si, SiN or Ge is formed on a non-absorbing layer of InGaP which is formed on the facets of a semiconductor laser main body.

In yet still one other instance, the wafer is cleaved in a ultra high vacuum chamber to provide a laser bar, and cleaved end faces of the laser bar are covered with semiconductor amorphous layers, as protective layers, of a compound semiconductor material between a third group element and a fifth group element in the element periodic table, to form a protected laser bar. An example of the amorphous layer is of GaAs semiconductor material.

In a further instance, after cleaving, one or more laser bars are transferred to a deposition chamber for application of the single crystal layers. The epitaxial growth of the single crystal layers requires that the surfaces are substantially contamination-free. This can be done either by cleaving under UHV conditions and maintaining the laser bars under UHV conditions after cleaving, or by cleaving in air followed by end surface ion etching prior to depositing the layers.

Laser diodes, passivated with the conventional passivation techniques as described above, eventually fail by catastrophic optical damage if driven to sufficiently high optical power density.

There is a need for higher power or higher power density laser devices. One method of achieving higher power/power-density laser diodes is by improving passivation.

BRIEF SUMMARY

In one embodiment, the method of these teachings includes processing a semiconductor structure comprising an active waveguide of a semiconductor laser in an environment substantially free of contamination in order to provide substantially contamination free mirror facets at the ends of the active waveguide, and depositing on the substantially contamination free mirror facets a single crystal passivation layer comprised of a semiconductor material (referred to also as a semiconductor) whose bandgap exceeds that of both the active layer and the waveguide layers and that does not form misfit dislocations with the laser diode semiconductor, the deposition occurring at a temperature at which the semiconductor structure does not degrade.

For a better understanding of the present teachings, together with other and further needs thereof, reference is made to the accompanying drawings and detailed description and its scope will be pointed out in the appended claims.

BRIEF DESCRIPTION OF THE DRAWINGS

FIG. 2 is a graphical block diagram representation of one embodiment of the method of these teachings.

DETAILED DESCRIPTION

Figure 1:
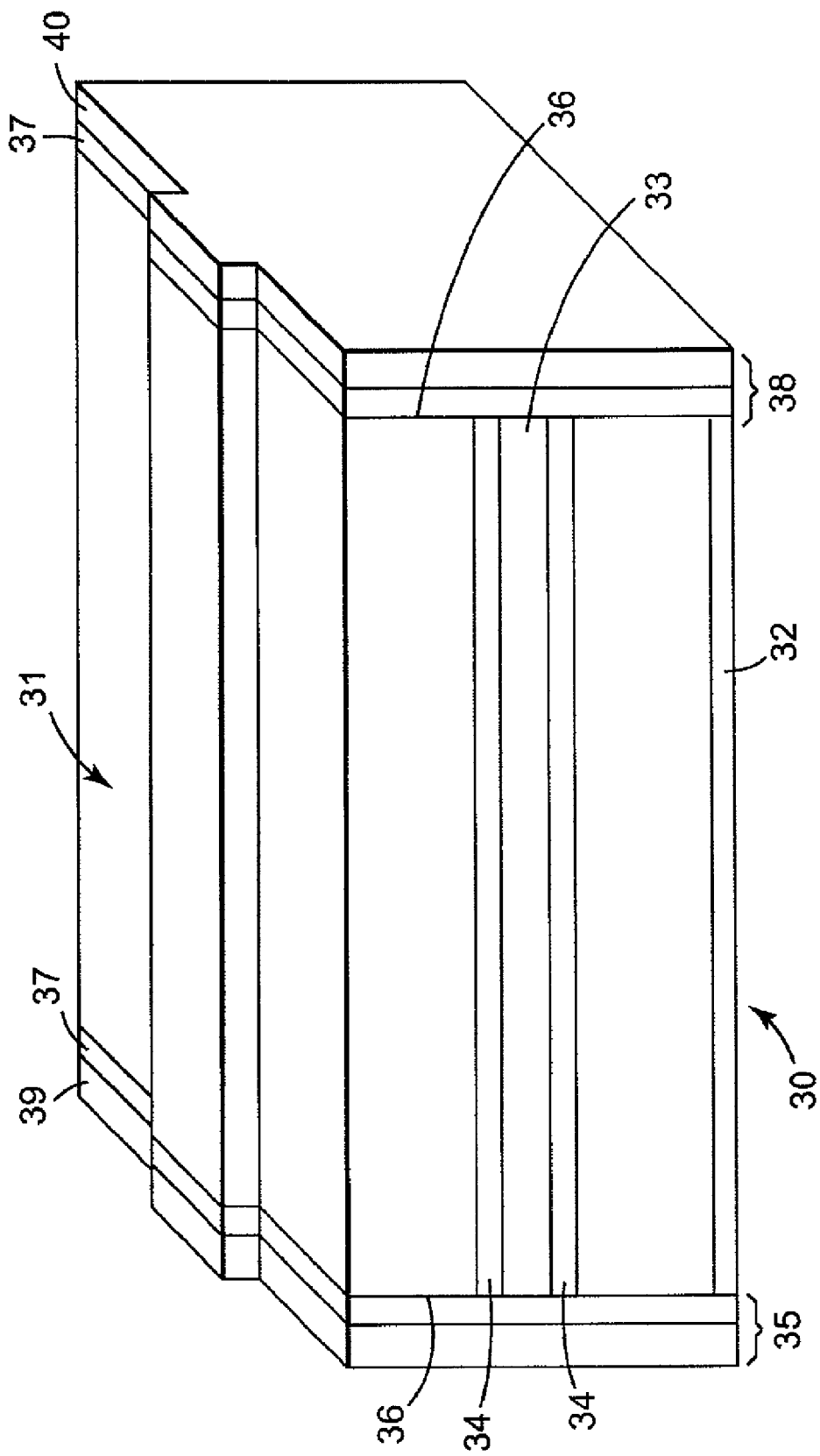
FIG. 1 is a graphical description of a conventional semiconductor laser to which these teachings can be applied.

An exemplary semiconductor lasers structure on which the present teachings can be practiced is shown in FIG. 1. It should be noted that their present teachings are not limited to that structure. As shown therein, the semiconductor laser 30 includes a multilayer structure 31 deposited on a substrate 32. The details of the multilayer structure 31 are not critical to the present invention, and thus will not be described in detail. However, the multilayer structure generally includes an optically active layer 33 surrounded by two cladding layers 34, so as to define a waveguide. After formation of the multilayer structure metallic contacts are applied to the top and bottom surfaces so as to create a preprocessed laser structure. The multilayer structure 31 further defines opposing end surfaces 36. The structure shown in FIG. 1 is characteristic of a semiconductor structure forming an active waveguide of a laser diode.

FIG. 2 is a graphical block diagram representation of one embodiment of the method of these teachings. Referring to FIG. 2, in the embodiment shown therein, substantially contamination free mirror facets are formed at the ends of the active waveguide (110, FIG. 2). A single crystal passivation layer is deposited on the substantially contamination free mirror facets, the deposition occurring at a temperature at which a semiconductor structure does not degrade (120, FIG. 2).

An important step in the fabrication of a semiconductor laser (also referred to as a laser diode) is the formation of the "mirrors." The formation of the "mirrors" can be performed, for example, by cleaving or by etching. A first aspect of the method of these teachings is to provide a substantially contamination free laser facet ("mirror"). This is achieved by cleaving the devices in an ultrahigh vacuum (such as <$10^{-6}$ Pa=$7.5 \times 10^{-9}$ Torr). Similar principles can be applied to etched laser devices. After obtaining a substantially contamination free facet, a single crystal passivation layer is grown on the facet. The single-crystal passivation layer is grown on the facet using a technique such as, but not limited to MBE (molecular beam epitaxy), at a temperature at which the processed semiconductor structure does not degrade, e.g., but not limited to, $\leq 450°$ C., in one instance, or $\leq 500°$ C. in another instance. The single-crystal passivation layer is comprised of a semiconductor whose bandgap exceeds that of the active layer and the waveguide layers and that does not form misfit dislocations with the laser diode semiconductor, i.e. the lattice spacing of the deposited semiconductor is within about 0.5% of the lattice spacing of the waveguide layers. Exemplary embodiments of semiconductors that can be using these teachings include III-V compounds such as, but not limited to, $Al_{(x)}Ga_{(1-x)}As$, $In_{(x)}Ga_{(1-x)}As$, $In_{(x)}Ga_{(1-x)}As_{(y)}P_{(1-y)}$. For passivation purposes, the range is as small as a few atomic layers to as thick as can be grown. To maintain high optical beam quality of the laser diode, the maximum thickness should not exceed about 100 wavelengths.

For the purposes of describing and defining the present teachings, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Although the teachings have been described with respect to various embodiments, it should be realized these teachings are also capable of a wide variety of further and other embodiments within the spirit and scope of the appended claims.

What is claimed is:

1. A method for passivating semiconductor laser structures, the method comprising the steps of:

processing, in a substantially free of contamination environment, a semiconductor structure comprising an active waveguide of a semiconductor laser in order to provide substantially contamination free mirror facets at the ends of the active waveguide; and depositing on the substantially contamination free mirror facets a single crystal passivation layer comprised of a semiconductor material whose bandgap exceeds that of both active layer and waveguide layers of the active waveguide and wherein the passivation layer does not form misfit dislocations with the semiconductor structure;

the deposition occurring at a temperature at which the semiconductor structure does not degrade.

2. The method of claim 1 wherein the step of processing, in a substantially free of contamination environment comprises cleaving the semiconductor structure in an ultrahigh vacuum.

3. The method of claim 2 wherein the cleaving the semiconductor structure occurs at a pressure of less than about $10^{-6}$ Pa.

4. The method of claim 1 wherein the deposition occurs at a temperature of at most 450° C.

5. The method of claim 1 wherein the deposition occurs at a temperature of at most 500° C.

6. The method of claim 1 wherein a lattice spacing of the deposited single crystal passivation layer is within about 0.1% of the lattice spacing of the waveguide layers.

7. The method of claim 1 wherein the deposited semiconductor material is $Al_{(x)}Ga_{(1-x)}As$.

8. The method of claim 1 wherein the deposited semiconductor material is $In_{(x)}Ga_{(1-x)}As_{(y)}P_{(1-y)}$.

9. The method of claim 1 wherein the deposited semiconductor material is deposited by molecular beam epitaxy (MBE).

10. The method of claim 1 wherein a thickness of the deposited semiconductor material is at most 100 wavelengths.

11. The method of claim 1 wherein the semiconductor structure is a III-V semiconductor laser structure.

12. A semiconductor laser structure passivated by the method of claim 1.

* * * * *